United States Patent
Venkatachary

(10) Patent No.: US 7,739,445 B1
(45) Date of Patent: *Jun. 15, 2010

(54) CIRCUIT, APPARATUS, AND METHOD FOR EXTRACTING MULTIPLE MATCHING ENTRIES FROM A CONTENT ADDRESSABLE MEMORY (CAM) DEVICE

(76) Inventor: Srinivasan Venkatachary, 637 Timberpine Ave., Sunnyvale, CA (US) 94086

( * ) Notice: Subject to any disclaimer, the term of this patent is extended or adjusted under 35 U.S.C. 154(b) by 497 days.

This patent is subject to a terminal disclaimer.

(21) Appl. No.: 10/866,353

(22) Filed: Jun. 11, 2004

(51) Int. Cl.
*G06F 12/00* (2006.01)
*G11C 15/00* (2006.01)

(52) U.S. Cl. .................. 711/108; 365/49.17
(58) Field of Classification Search .......... 707/3, 707/100, 758, 773; 711/108; 365/49.17
See application file for complete search history.

(56) References Cited

U.S. PATENT DOCUMENTS

| | | | |
|---|---|---|---|
| 5,111,453 A * | 5/1992 | Morrow | 370/401 |
| 5,414,704 A * | 5/1995 | Spinney | 370/389 |
| 5,438,535 A * | 8/1995 | Lattibeaudiere | 365/49.17 |
| 6,289,414 B1 | 9/2001 | Feldmeier et al. | |
| 6,324,087 B1 | 11/2001 | Pereira | |
| 6,546,391 B1 * | 4/2003 | Tsuruoka | 707/8 |
| 6,606,681 B1 | 8/2003 | Uzun | |
| 6,697,803 B2 | 2/2004 | Abdat | |
| 6,707,694 B2 | 3/2004 | Regev | |
| 6,711,041 B2 | 3/2004 | Pereira et al. | |
| 6,717,946 B1 | 4/2004 | Hariguchi et al. | |
| 6,906,936 B1 * | 6/2005 | James et al. | 365/49.17 |
| 2003/0039135 A1 * | 2/2003 | Srinivasan et al. | 365/49 |

OTHER PUBLICATIONS

U.S. Appl. No. 11/298,206, filed Dec. 8, 2005, Rosman.
Final Office Action in co-pending U.S. Appl. No. 11/298,206, filed Dec. 8, 2005, mailed Jan. 22, 2009, 13 pages.
Notice of Panel Decision from Pre-Appeal Brief Review in in co-pending U.S. Appl. No. 11/298,206, filed Dec. 8, 2005, mailed Jun. 24, 2009, 2 pages.

* cited by examiner

*Primary Examiner*—John R. Cottingham
*Assistant Examiner*—Mariela D Reyes

(57) ABSTRACT

An apparatus, circuit, and method are provided herein for locating and extracting a plurality of matching entries from one or more databases stored within a Content Addressable Memory (CAM) device. The apparatus, circuit, and method may locate the plurality of matching entries by comparing variations of a single search key to the entire database of entries. In other words, a number of bits may be stored within each of the database entries as a descriptor field. When searching for a particular entry or entries, a corresponding descriptor field included within (or appended to) the search key may be modified, after at least one matching entry is found, for locating and extracting additional entries matching the original search key. Use of the descriptor field, therefore, enables the circuit and method to locate and extract a potentially unlimited number of entries matching the original search key. The circuit and method may be used for extracting 'k' matching entries, the first 'k' matching entries, or all entries matching the original search key.

30 Claims, 9 Drawing Sheets

CIRCUIT, APPARATUS, AND METHOD FOR EXTRACTING MULTIPLE MATCHING ENTRIES FROM A CONTENT ADDRESSABLE MEMORY (CAM) DEVICE

BACKGROUND OF THE INVENTION

1. Field of the Invention

This invention relates to searchable database applications and, more particularly, to circuits and methods for locating and extracting a plurality of matching entries by comparing variations of a single search key to a database of entries.

2. Description of the Related Art

The following descriptions and examples are not admitted to be prior art by virtue of their inclusion within this section.

A communication network is generally recognized as an interconnection of forwarding devices that process and send packets of information across the network. The network can either be an Internet or an Intranet and the forwarding devices can be gateways, bridges, switches, or routers. One objective of the forwarding devices is to reliably forward the packets from a source to a destination.

In whatever form, a forwarding device typically includes one or more lookup tables. An incoming destination address (or other search key) is derived from a packet of information and compared against entries stored within the lookup table. Resulting from the search, the associated packet of information may be processed according to a set of rules and sent to an appropriate output port of the forwarding device. As links of the network change, routing protocols exchange information among the forwarding devices in order to change the entries stored within the corresponding lookup tables. This change will modify not only the entries within the lookup table, but also the next-hop identifiers or other associated data pointed to by the addresses of those entries. Routing through the forwarding devices can, therefore, be changed dynamically as links go down and come back up in various parts of the Internet or Intranet.

A popular implementation of the lookup table involves content-addressable memory (CAM) device. One important feature of a CAM is that fairly fast searches can be undertaken of any database, list, pattern, image, or voice-recognition data stored within a computer or a component within a communications network. For example, memory searches can be quickly performed in a CAM by comparing a search key against each of the CAM entries in parallel. As a result, CAM devices are often employed in network equipment (e.g., forwarding devices), computer systems and other devices that benefit from rapid content searching.

To enable rapid searching, CAMs are often organized differently than other memory devices (e.g., a random access memory, or RAM). In a RAM, for example, data is stored in a particular location, called an address. When conducting a memory search within a RAM, the address of a memory location is supplied to retrieve the data stored in that memory location. In a CAM, however, data is often stored in a random fashion. The locations at which data is stored within a CAM can be arbitrary. For example, the locations may be selected by an address, or the data may simply be written into the first available memory location. Once data is stored in a CAM, the stored data can be found by comparing all of the CAM entries with input data (i.e., a search key) placed in a comparand register. When the content stored in a CAM memory location does not match the data placed in the comparand register, the CAM device returns a "no match" indication. If a match is found, however, the CAM device returns a "match" indication by asserting the match line for that entry. The CAM device will also return the address of the memory location in which the matching data is stored. A CAM thereby operates opposite that of a conventional memory device by receiving data, and returning a matching CAM index, address, or location.

For every CAM entry that matches the data in the comparand register, a corresponding match line will be asserted to indicate a match condition. If the data in the comparand register matches more than one CAM entry, the match lines corresponding to each of the matching CAM entries are asserted, along with a "multiple match" flag to indicate a multiple match condition. The match line signals from each CAM block are combined in a priority encoder to determine the address of the highest-priority matching CAM entry. In some cases, the highest-priority matching entry may be the "longest-matching prefix entry," or the CAM entry containing the greatest number of most significant bits matching the search key. In any case, the address of the highest-priority matching entry (i.e., the CAM index) may be extracted from the CAM and forwarded to a memory location (specified by the CAM index) of an associated memory device. The associated memory device (e.g., an associated RAM device) may then direct the packet of information to an appropriate output port of the forwarding device.

Though various methods have been devised for detecting multiple match conditions, no methods currently exist for easily extracting a potentially unlimited number of entries matching a single search key. In some cases, a valid bit may be stored within each of the CAM entries. The valid bit may be set for each valid entry in the CAM (i.e., each memory location containing useful stored data) so that only the valid CAM entries will be searched. In order to extract multiple matching entries from the CAM, a first matching entry must be invalidated (to exclude that entry from further searches) before the search key is re-issued to find a next matching entry. Though multiple matching entries may be found in this manner, it is undesirably slow and cannot be implemented within multi-threaded systems (such as today's packet processors), which require multiple threads to have simultaneous access to the CAM device.

To accommodate multi-threaded systems, the above method may utilize a plurality of valid bits per CAM entry, one for every thread sharing the CAM device. However, the number of valid bits needed is directly proportional to the number of threads requiring simultaneous access to the CAM device. Though conventional methods may include up to 8 valid bits for supporting up to 8 threads, they cannot provide a viable solution for many of today's multi-threaded packet processors, which may contain between 32 and 128 threads. Since each CAM entry contains a fixed number of bits (e.g., about 72 to 576 bits or more), allocating an increasing number of those bits to a valid bit field may ultimately prevent any data from being stored within the CAM entries.

Therefore, a need exists for an improved method for extracting a potentially unlimited number of CAM entries matching a single search key. The improved method may be used in modern applications, which require 'k' matches, the first 'k' matches or all entries matching a particular search key to be extracted from a CAM device. Unlike conventional methods, the improved method may be equally applied to single-threaded systems and multi-threaded systems with substantially any number of threads.

SUMMARY OF THE INVENTION

The problems outlined above may be in large part addressed by an apparatus, circuit and method for locating and extracting a plurality of matching entries from a database of entries stored within a Content Addressable Memory (CAM) device. In general, the apparatus, circuit and method may locate the plurality of matching entries by comparing variations of a single search key to the entire database of entries. As described in more detail below, a number of bits may be stored within each of the database entries as a descriptor field. When searching for a particular database entry or entries, a corresponding descriptor field included within (or appended to) the search key may be modified, after at least one matching entry is found, for locating and extracting additional entries matching the search key. Use of the descriptor field, therefore, enables the circuit and method to locate and extract a potentially unlimited number of entries matching the original search key. Unlike conventional methods, the method described herein may be used in modern applications, which require 'k' matching entries, the first 'k' matching entries, or all entries matching a particular search key to be extracted from one or more databases stored within a CAM device. Thus, the method described herein may be equally applied to single-threaded systems and multi-threaded systems with substantially any number of threads.

In one embodiment, an apparatus is provided herein for locating and extracting a plurality of matching entries from a CAM device. The apparatus may be a processing device selected from a group comprising: a central processing unit (CPU), an application specific integrated circuit (ASIC), a field programmable gate array (FPGA), a network processing unit (NPU) or a packet processor. In some cases the apparatus may be included within one or more line cards of a network forwarding device, such as a router, switch, gateway or bridge. However, the apparatus should not be limited to a network forwarding device in all embodiments of the invention, but instead, should be considered applicable to any database-related system or device.

The apparatus may include a circuit portion and a software portion. The circuit portion may be configured for using the single search key to locate an initial matching entry, and producing a set of modified search keys based on a location of the initial matching entry. The set of modified search keys may represent the "variations of the single search key" mentioned above. The circuit portion may also be configured for using one or more of the modified search keys to locate and extract additional entries matching the search key. In some cases, the additional matching entries may be extracted until a predetermined number of matching entries has been extracted or the set of modified search keys have all been used. In other cases, however, the circuit portion may be further configured for: (i) producing a new set of modified search keys based on the location of an additional matching entry, and (ii) using one or more of the new set of modified search keys to locate and extract the additional matching entries. The new set of modified search keys may be used before or after the set of modified search keys have all been used.

The software portion of the apparatus may be configured for initializing the circuit portion with the predetermined number of matching entries to be extracted from the database, where the predetermined number corresponds to a number of entries matching the single search key and the variations thereof. The software portion may be further configured for storing a descriptor field value within each of the database entries, and updating the descriptor field values when entries are added or deleted from the database.

In another embodiment, a circuit is provided herein for locating and extracting a plurality of matching entries from a database of entries stored within a CAM device. In some cases, the circuit may be incorporated within the CAM device. In other cases, however, the circuit may be incorporated within an apparatus, which is operably coupled to the CAM device for receiving and utilizing the plurality of entries extracted from the database. As noted above, the apparatus may be a processing device selected from a group comprising: a central processing unit (CPU), an application specific integrated circuit (ASIC), a field programmable gate array (FPGA); a network processing unit (NPU) or a packet processor.

In a general embodiment, the circuit may include an input conductor coupled for receiving a search key, and a logic block coupled to the input conductor. The logic block may be configured for (i) producing a set of modified search keys after at least one matching entry is located with the search key and extracted from the database, and (ii) using one or more of the modified search keys to locate and extract additional matching entries from the database. In some cases, the logic block may be further configured for locating and extracting the additional matching entries until a predetermined number of matching entries has been extracted from the database, or the set of modified search keys have all been used.

In some cases, the circuit may also include a set of registers, a counter and one or more global mask registers, each of which may be used by the logic block for locating the plurality of matching entries. For example, the set of registers may be used for storing the search key and the set of modified search keys related to the search key, whereas the counter may be used for counting the number of matching entries extracted from the database. In some cases, the global mask registers may be used by the logic block to produce the set of modified search keys. For example, global mask registers may be used for replacing one or more bits within a descriptor field portion of the matching entry with masked bits. A modified search key can then be produced by appending the modified descriptor field portion onto the original search key. In other cases, however, the number of global mask registers may be reduced or eliminated altogether from the circuit.

In yet another embodiment, a method is provided herein for locating and extracting a plurality of matching entries from a database of entries stored within a CAM device. In a general embodiment, the method may include: (i) receiving a search key, which is used to locate and extract an initial matching entry from the database, (ii) producing a first set of modified search keys by modifying one or more bits within a descriptor field portion of the initial matching entry, and (iii) using one of the first set of modified search keys for locating and extracting an additional matching entry from the database. In some cases, the method may repeat the step of using one of the first set of modified search keys until a predetermined number of matching entries has been extracted from the database or the first set of modified search keys have all been used.

In other cases, the method may produce a second set of modified search keys once an additional matching entry has been located. For example, the method may produce the second set of modified search keys by modifying one or more bits within a descriptor field portion of the additional matching entry. The method may then use one of the second set of modified search keys for locating and extracting another additional matching entry from the database. In most cases, the second set of modified search keys may be used in subsequent search operations returning to the first set of modified search keys.

In some cases, one or more steps may be performed before or during the step of receiving a search key. In one example, a predetermined number and/or order of matching entries to be extracted from the database may be designated before or after the search key is received. In another example, the database entries may be divided into a plurality of sub-databases before the search key is received, where each sub-database is assigned a descriptor field value and stored within a different portion of the CAM device. Regardless of whether or not the database entries are divided into sub-databases, a descriptor field value may be stored within database each entry. The descriptor field values may be used for limiting the set of entries that may return a matched result in subsequent search operations.

In some cases, an offset value may be stored within the descriptor field portion of each database entry. If the database is divided into a number of sub-databases, the offset values may be produced by counting the number of sub-databases and assigning a unique count to each sub-database of entries. Otherwise, each of the database entries are counted and assigned a unique count. To search for a particular entry or entries, a descriptor field portion of a search key may be masked to produce a masked search key, which may then be used for locating an initial matching entry. To locate additional matching entries, a first set of modified search keys may be produced by: (i) changing the least significant "0" bit in the descriptor field portion of the initial matching entry to a "1" bit, (ii) replacing any descriptor field bits following the changed bit with masked bits to produce one of the modified search keys, and (iii) repeating the steps of changing and replacing until no more "0" bits remain in the descriptor field portion of the initial matching entry.

Instead of using the offset values to search for a particular entry or entries, a prefix length of the database entries may be detected, stored within the descriptor field portions of the database entries, and used for searching. The lengths may be detected by counting the number of most significant bits within a prefix portion of the database entries. Once an initial matching entry is located as described above, additional matching entries may be located by producing the first set of modified search keys in a slightly different manner. For example, the first set of modified search keys may be produced by: (i) changing the least significant "1" bit in the descriptor field portion of the initial matching entry to a "0" bit, (ii) replacing any descriptor field bits following the changed bit with masked bits to produce one of the modified search keys, and (iii) repeating the steps of changing and replacing until no more "1" bits remain in the descriptor field portion of the initial matching entry.

Other steps that may be performed before the search key is received include, e.g., storing a second descriptor field value within an additional descriptor field portion of each database entry. The second descriptor field value may be used to reduce the number of searches needed for locating and extracting the additional matching entries. In some cases, a further step may be performed to reduce the number of bits that can be masked within the descriptor field portion(s) of each database entry. Such a step may reduce the number of global masking registers needed for masking the bits within the descriptor field portion(s).

BRIEF DESCRIPTION OF THE DRAWINGS

Other objects and advantages of the invention will become apparent upon reading the following detailed description and upon reference to the accompanying drawings in which.

Figure 1:
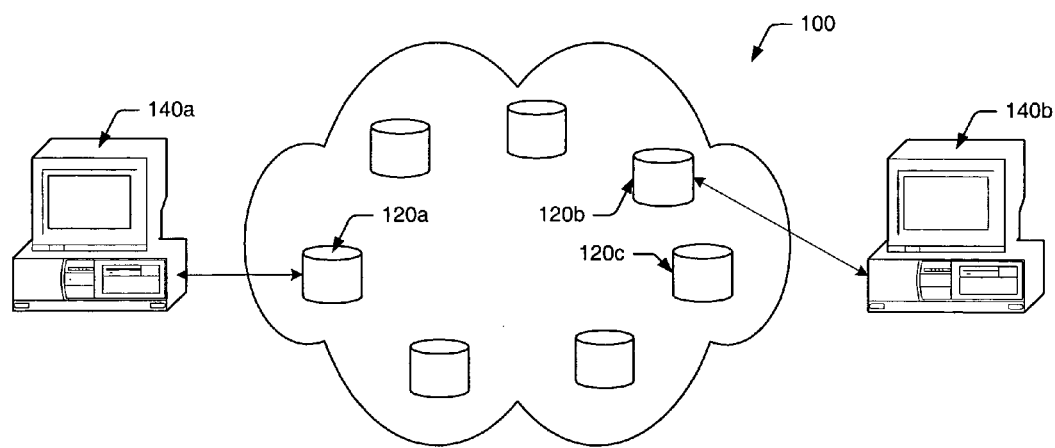
FIG. 1 is a block diagram of a communication network.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Although the term "network" is specifically used throughout this disclosure, the term network is defined to include the Internet and other network systems, including public and private networks that use the Internet Protocol (IP) protocol suite for data transport. Examples include the Internet, Intranets, extranets, telephony networks ("using voice over IP"), and other wire-line and wireless networks that converge on the use of the IP family of protocols. Although the term "Internet" may be used throughout this disclosure, the term Internet is merely one example of an IP "network."

FIG. 1 illustrates possibly numerous forwarding devices 120 within a computer network 100. The topology of the Internet or the Intranet interposed between computers 140 can vary. If computer 140a wishes to send a packet of data to computer 140b, then it must do so by traversing one or more forwarding devices 120 within network 100. Forwarding device 120a might receive the packet, which includes a destination address of, for example, forwarding device 120b (or computer 140b). Determining where to send the packet within network 100 so that the packet arrives at a forwarding device (or hop) closer to the destination, is essentially the function of the routing table within the forwarding device 120a. Optimally, the routing table within forwarding device 120a will receive the destination address, and will compare that address (or "search key") to prefix entries stored within the routing table. Associated with each prefix entry might be a next hop identifier. Thus, once a prefix entry is found that matches (using, for example, the longest prefix match comparison) the destination address, the packet can be routed to the next hop to be one step closer to the intended destination.

Figure 2:
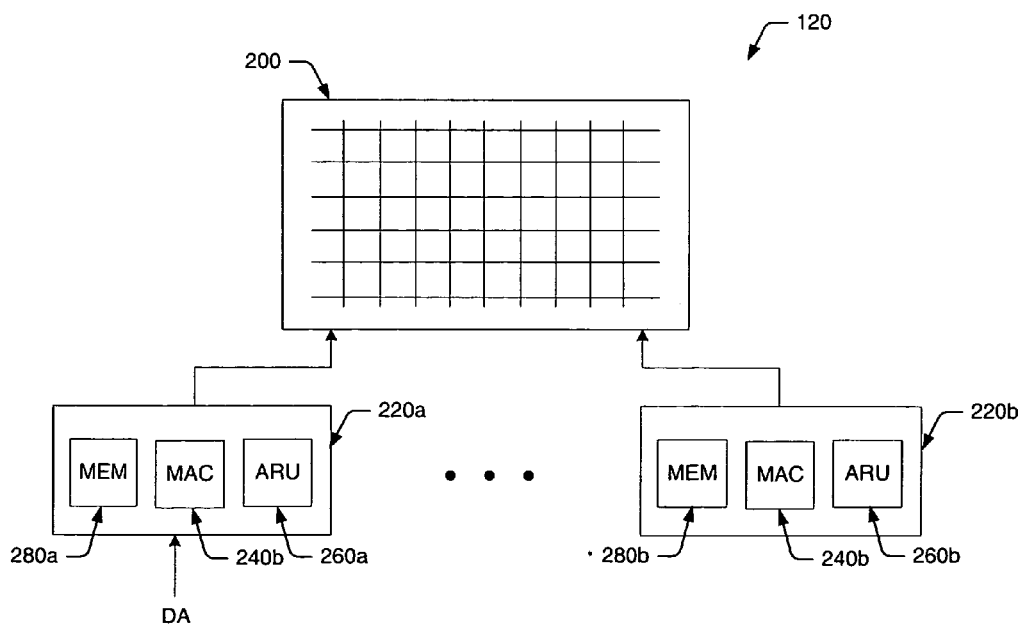
FIG. 2 is a block diagram of a packet-forwarding engine, or "forwarding device" (e.g., a switch or router) within the communication network of FIG. 1.

FIG. 2 illustrates one example of forwarding device 120, such as a router, gateway, bridge, or switch. Forwarding device 120 is often called a "packet-forwarding engine" and may contain a switching fabric 200 and a plurality of line cards 220. Switching fabric 200 is generally well known, and may involve a crossbar switch that interconnects all the line cards with one another. At least one line card may contain a routing processor. Forwarding device 120 can, therefore, be thought of as performing two functions: (i) performing route lookup based on the destination address of the packet in order to identify an outgoing port; and (ii) switching the packet to the appropriate output port.

The routing function can be performed primarily on the incoming line card (e.g., line card 220a), whereas switching of the packet to the appropriate output port or line card can take place within switching fabric 200. The Destination Address (DA) of the packet can enter line card 220a via an I/O interface. Each line card typically includes a Media Access Controller (MAC) 240, an Address Resolution Unit (ARU) 260, and a memory device 280. MAC 240 can be configured to accept many different communication protocols, such as, e.g., the Carrier Sense Multiple Access/Collision Detect (CSMA/CD), Fiber Distributed Data Interface (FDDI), or Asynchronous Transfer Mode (ATM) communication protocols. As packets are read from ingress MAC 240a, forwarding control information necessary for steering the packet through switching fabric 200 will be prepended and/or appended to those packets.

In some cases, the ARU 260 at the ingress line card may perform the routing function using the longest prefix match comparison technique. The ARU can perform classless or class-based routing functions and can support Variable Length Subnet Masks (VLSM). Each ARU can be reconfigured—as routes are added or deleted from the network—using well-known routing protocols, such as RIP, OSPF, or BGP. The memory device 280 can be implemented in various types of Random Access Memory (RAM), such as DRAM, SRAM, or Content-Addressable Memory (CAM), a popular form of masking CAM being Ternary CAM (or TCAM). Memory 280 may contain various lookup tables, such as a pointer table, a routing table and/or a next hop table. If one or more of the lookup tables are copied and placed within the line card 220, lookups on incoming packets can be performed locally, without loading the central processor of forwarding device 120. As used herein, a local copy of a lookup table may be referred to as a "forwarding table," and may be stored in another memory device (not shown in FIG. 2).

In some cases, additional lookup tables may be included to make the overall routing algorithm "flow-aware." Instead of routing individual packets of data using a best-effort service, for example, the packets can be classified into specific flows. Routers or switches that are flow-aware may be used to classify incoming packets according to differentiated services. All packets belonging to the same flow may be treated in a similar manner.

A collection of rules or policies can be defined to determine whether a packet belongs to a specific flow before the packet is sent to its next hop. The rules or policies define an action to be applied to the packet, such as denying or allowing access to a protected network. Rules or policies that specify a particular flow are often based on the source address, destination address, and other designators within the incoming packet. For example, a packet filtering technique may use a rule or policy for denying all traffic from a particular Internet service provider (ISP) destined to a particular address. In addition to packet filtering, various rules may be employed to provide policy routing, rate-limiting, and traffic shaping abilities. Some or all of these rules may be defined within another lookup table—referred to as an access control list (ACL)—stored in a database.

The above-mentioned tables can be maintained in separate memory devices or in different portions of the same memory device. For example, one memory device may be used by a router for storing an ACL table, while another memory device may be used by the router to match the destination address of an incoming packet to one or more entries contained within a routing or forwarding table. However, the same memory device may be used, in other examples, for storing and searching through one or more different types of tables. In some applications, it may be desirable to extract a plurality of matching entries from one or more tables stored within a given memory device. For example, one may wish to extract all of the routing table entries matching a particular destination address. In another example, a load balancing switch may direct packets to the servers experiencing the least load by first extracting all ACL table entries matching a particular rule set, and then using a different metric for directing a packet to a particular server.

Figure 3:
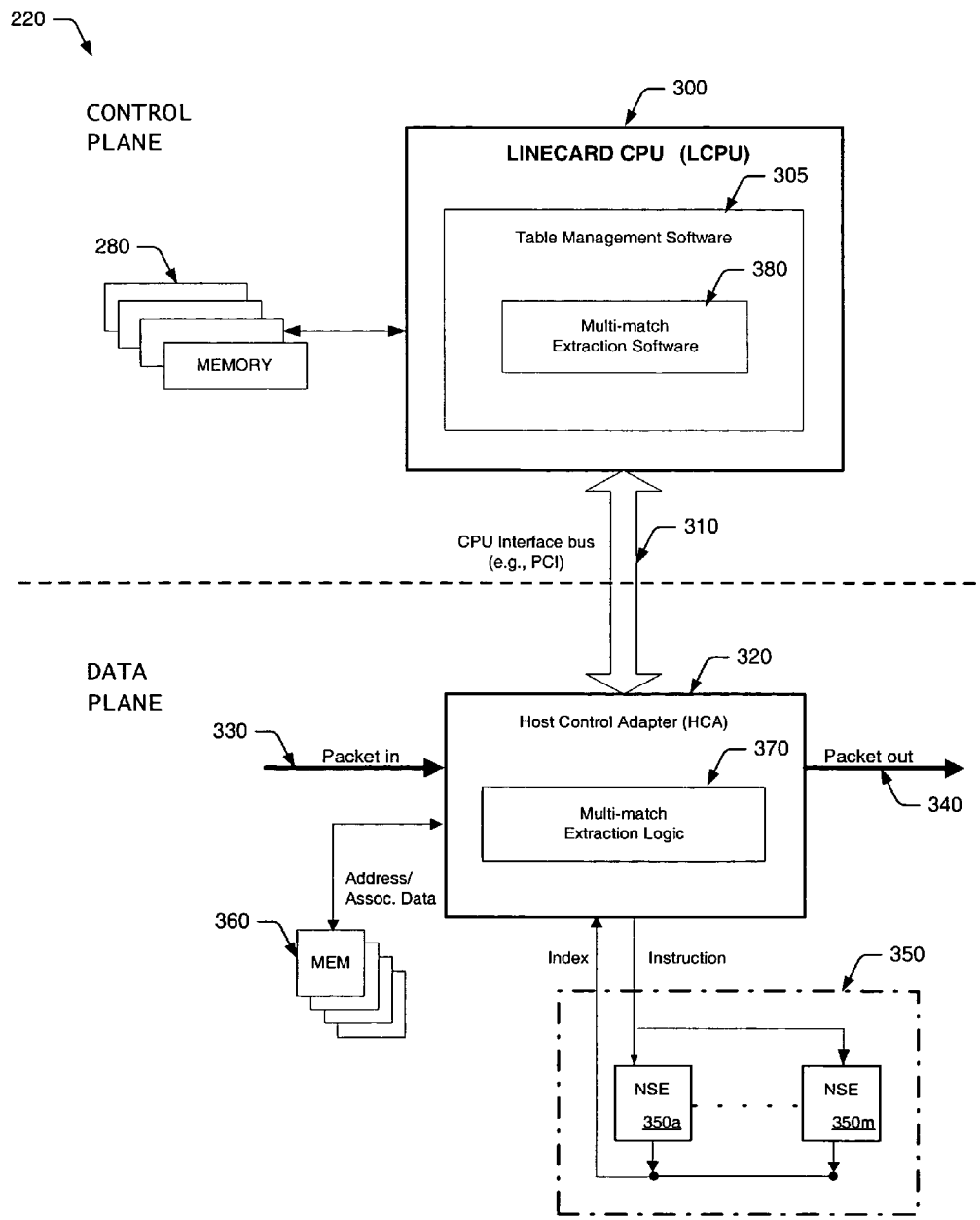
FIG. 3 is a block diagram of various software and hardware components that may be found within one or more line cards of the forwarding device of FIG. 2, including multi-match extraction logic and software components within one or more processors of the forwarding device.

Circuits and Apparatuses for Locating and Extracting a Plurality of Matching Entries From a Cam Device FIG. 3 illustrates various hardware and software components that may be included within one or more line cards 220 of forwarding device 120 (FIGS. 1 and 2). As will be described in more detail below, line card 220 may include one or more memory devices, each of which may be used for storing one or more lookup tables. Exemplary lookup tables may include, but are not limited to, routing tables, forwarding tables and ACL tables (which may include, e.g., filtering tables, Quality of Service tables, etc.). To overcome the problems encountered in conventional search operations, line card 220 may include an improved means for locating and extracting a plurality of matching entries from one or more of the lookup tables stored therein. Such means may be included within one or more line card processing devices, or within the memory devices themselves.

As shown in FIG. 3, line card 220 may contain a Network Search Engine ("NSE") 350 in the data plane of the line card with supporting components in the control plane of the line card. In some cases, a central processor 300 (referred to as a line card CPU or "LCPU") may be included within the control plane of line card 220 for managing the hardware components of the line card. For example, LCPU 300 may be configured for running table management software 305. In general, software 305 may be used to compute and maintain the lookup tables stored within memory 280 and NSE 350. Though control plane memory 280 may include substantially any type of memory device, a static or dynamic RAM device may be preferred in most embodiments of the invention. Control plane memory device 280 may be used for storing table management software 305, along with various lookup tables, including ACL tables, pointer tables, routing tables and next hop tables. The LCPU may communicate with the data plane components via interface bus 310.

Though a central processor (i.e., LCPU 300) is used herein for managing the forwarding database of a line card, such function should not be limited to a central processor in all embodiments of the invention. Other programmable units, such as, e.g., network processing units ("NPU"), custom designed Application Specific Integrated Circuits ("ASIC") or Field Programmable Gate Arrays ("FPGA") could replace LCPU 300 in alternative embodiments of the invention.

As shown in FIG. 3, a Host Control Adapter (HCA) 320 may be included within the data plane of line card 220 for handling and processing the data packets arriving at input port 330. HCA 320 could be, e.g., a custom-designed ASIC or a packet processor. The HCA is generally responsible for parsing the incoming data packets, extracting the destination address (or another search key), and performing the lookup in the forwarding tables stored within NSE 350. Though LCPU 300 and HCA 320 are both shown in the embodiment of FIG. 3, alternative embodiments of the invention may include only one processing device (e.g., LCPU 300 or HCA 320).

In some embodiments, NSE 350 may include an array of NSE modules (350a . . . 350m), in addition to the search engine software (not shown) that runs on the LCPU and manages the NSE array. The NSE array may be implemented in a variety of configurations, such as one search engine subsystem (i.e., one NSE array) on each line card in a distributed architecture, or one search engine subsystem on a centralized card. In a distributed architecture, control plane processing may be required for computing the forwarding table from the routing table. The control plane processing can be carried out independently on each line card, or on one centralized card.

As used here, the term "Network Search Engine" or "NSE" may refer to any device capable of: (i) storing a database of entries, (ii) using a search key to search for a particular entry within the database of entries and, as a result of the search, (iii) returning one or more indices of matching entries (i.e., entries that have at least one bit in common with the search key). The entries stored within the database can be "exact match entries" (e.g., complete IP destination addresses), "prefix entries" (e.g., one or more most significant bits of the IP destination address followed by a masked entry), or "lopped-off" prefix entries (e.g., prefix entries with one or more of their most significant bits replaced by a masked entry).

To perform a search or lookup operation, NSE 350 may carry out a simple request-response transaction, usually once every clock cycle. To initiate a "search request," a read instruction may be sent from LCPU 300 for locating an entry within the forwarding table of the NSE array that matches a particular search key. The "search response" is the index returned by the NSE array indicating the best matching route corresponding to that search key. The HCA may use the index to lookup (or locate) the attached memory device 360 (e.g., SRAM or DRAM) containing the data associated with the best matching route(s). The HCA may then use the associated data to perform other packet processing functions before sending the packet to an appropriate output port 340, which may be specified by the associated data.

To facilitate fast lookup operations, one or more Content Addressable Memory (CAM) devices (not shown) may be included within NSE 350 for storing the forwarding table entries and possibly other types of table entries. Exemplary CAM devices may include binary, ternary, or pseudo-ternary CAMs. Binary CAMs are generally configured for storing binary entries, or entries that contain only "0" or "1" values. However, ternary CAMs (TCAMs) may be preferred over binary CAMs, in some embodiments, if enhanced flexibility is desired for storing or searching through the database of entries. This is because TCAMs store ternary entries, or entries that contain "0," "1," and "x" (i.e., "don't care") values. In some embodiments, a pseudo-ternary CAM may be used for storing a group of entries with a shared mask.

In some cases, a processing device may issue a search request for locating a plurality of entries matching a single search key. For example, LCPU 300 may issue a search request for locating and extracting the first 'k' number of forwarding table entries matching a particular destination address. As such, multi-match extraction logic 370 and software 380 may be included within the processing device (or within another processing device), so that the plurality of matching entries may be extracted from the forwarding table.

In some embodiments, multi-match extraction logic 370 may be included within HCA 320 for receiving the search key (sent from LCPU 300) and locating a plurality of entries matching the search key, as shown in FIG. 3. An exemplary circuit and method for locating and extracting a plurality of matching entries will be described in reference to FIGS. 5, 9 and 10. For the time being, however, multi-match extraction logic 370 may be generally described as configured for locating and extracting any 'k' number of entries, the first 'k' number of entries or substantially all of the entries matching the received search key. The number and order of entries to be extracted may be designated by the software (i.e., multi-match extraction software 380) responsible for initializing/ controlling multi-match extraction logic 370. Though FIG. 3 shows multi-match extraction software 380 as executed within LCPU 300, software 380 may be executed within HCA 320, or within a completely different processing device, in alternative embodiments of the invention.

By including the multi-match extraction logic 370 and software 380 components within one or more processing devices, conventional memory devices may be used for storing the various lookup tables that may be used in networking applications. In other words, the ability to extract multiple matching entries can be provided by the multi-match extraction logic and software components without modifying the architecture of a memory device. This may be advantageous if one wishes to keep costs low, and time-to-market short, by utilizing currently available CAM devices. However, there may be times in which one wishes to "close the gap" between multi-match extraction logic 370 and the memory device(s) storing the lookup tables.

Figure 4:
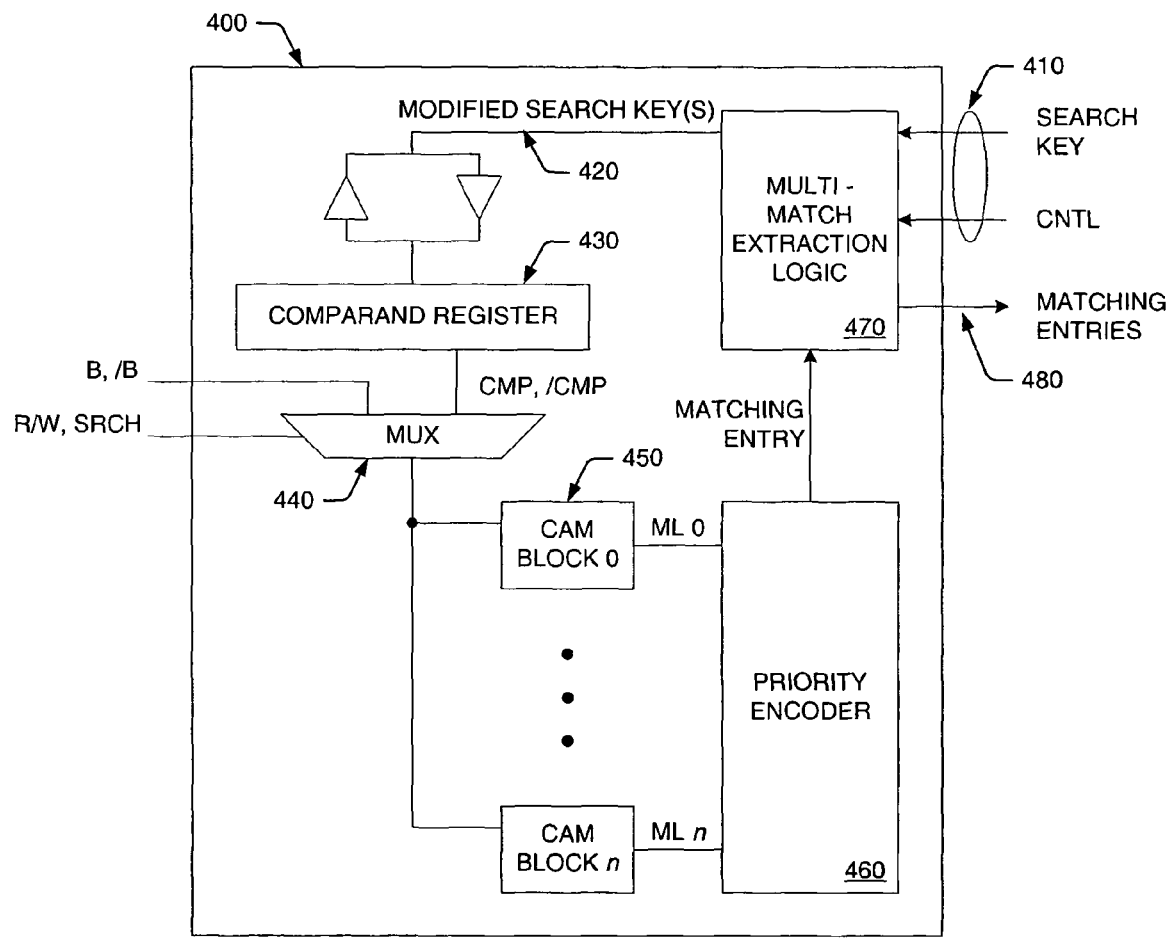
FIG. 4 is a block diagram illustrating how the multi-match extraction logic may, instead, be incorporated within a Content Addressable Memory (CAM) device.

In other embodiments, multi-match extraction logic 470 may be incorporated within a Content Addressable Memory (CAM) device 400, as shown in FIG. 4. For example, CAM device 400 may be included within NSE 350 for storing a forwarding table, or at least a portion thereof. Though substantially any type of CAM may be included within NSE 350, a Ternary CAM (TCAM) may be preferred over other CAM devices, due to the enhanced flexibility provided by ternary entries. In other words, an incoming data packet may contain both a destination network field and a destination host field. If a TCAM is used within NSE 350, one or more bits within the host field may be masked out (i.e., with "don't care" bits) so that a faster search operation may be conducted within the network field alone, before a second search operation is conducted within the unmasked host field. However, CAM device 400 may be included within control plane memory 280, or substantially any other memory device capable of storing a database of entries, in other embodiments of the invention.

FIG. 4 illustrates one embodiment of CAM device 400. In general, CAM device 400 is configured for receiving data to be written into storage cells, read from the storage cells, or compared with pre-existing data stored within storage cells. In particular, CAM device 400 is based on memory cells that have been modified by the addition of extra transistors, which compare the state of the bits stored in the memory cells with the data temporarily stored in comparand register 430. During a write or read operation, each memory cell within CAM device 400 acts like a normal SRAM cell, with differential bit lines (B and /B) used to latch the value into the cell during a write operation, and sense amplifiers to detect the stored value during a read operation. During a compare operation, differential compare lines (CMP and /CMP) are used in lieu of the differential bit lines.

Figure 7:
FIG. 7 is a block diagram illustrating one preferred embodiment of a search key (or database entry) that may be sent to (or stored within) a CAM device, where in addition to the search key (or index) portion, the preferred search key (or database entry) includes at least one descriptor field portion containing a number of bits unrelated to the number of threads utilizing the CAM device.
Figure 8:
FIG. 8 is a block diagram illustrating another preferred embodiment of a search key (or database entry) that may be sent to (or stored within) a CAM device, where the search key (or database entry) includes two or more descriptor field portions containing a number of bits unrelated to the number of threads utilizing the CAM device.

A number of the memory cells may be grouped to form each of the CAM words 450 shown in FIG. 4. The number of memory cells included within each CAM word may vary and typically range between about 72 and 576 memory cells per word. In some cases, a database of entries may be stored within CAM device 400 in a random order, for example, by storing each new entry within the next available CAM word 450. In other cases, however, a specific order may be adhered to when storing the database entries. In the context of routing and/or forwarding tables, the database entries having the longest prefix (e.g., the greatest number of bits in the network field) may be stored in the lowest numerical addresses of the CAM. In ACL tables, however, the database entries may be stored in a specific order imposed by an external entity (e.g., an order specified by a particular protocol, or by a network administrator). Regardless of the order in which the entries are stored, each entry is assigned at least one descriptor field (FIGS. 7-8). The descriptor fields may be stored along with the entries when the entries are first written to the database, and may be updated when entries are added or deleted from the database. As described in more detail below, the descriptor field may place a logical constraint on subsequent search operations by limiting the set of entries that can return a matched result.

As shown in FIG. 4, a multiplexer 440 may be used to forward the differential bit lines or the differential compare lines into each of the CAM memory cells, depending on the particular operation to be performed. For example, multiplexer (or select circuit) 440 may be used to enable the differential bit lines during a read or write operation, or to enable the differential compare lines during a search (or compare) operation. The multiplexer performs its selection similar to an encoder, which encodes whether the operation is a read, write or compare operation. In some embodiments, multiplexer 440 may actually comprise a group of multiplexers, one for every bit stored in the comparand register. The differential bit lines and differential compare lines may also be duplicated in a similar manner. For example, if comparand register 430 can store up to 48 bits, then there might be 48 multiplexers and 48 differential conductors for each of the CAM words 450 within CAM device 400. If there are n number of CAM words, and m number of multiplexers, CAM device 400 is said to be m bits wide and n words deep.

If every bit within comparand register 430 matches every bit within one or more CAM words 450, a match flag will be asserted upon a corresponding match line (ML0-MLn). An asserted match line indicates that the data stored within comparand register 430 was found within all memory cells of a CAM word. If at least one match is found, priority encoder 460 outputs a positive match indication and the address (or index) of the matching entry. In some cases, more than one match line may be asserted when the parallel search operation detects a matching entry within more than one of the CAM words 450. If more than one match is found, priority encoder 460 determines which of the match lines has top priority and outputs the address of that entry.

In some embodiments, priority encoder 460 may be designed for selecting the entry with the longest matching prefix by determining which match line (ML0 . . . MLn) is attributable to the lowest numerical CAM address. In FIG. 4, for example, CAM word n may be at CAM address 0, whereas CAM word 0 may be at the highest CAM address. The lowest CAM address or addresses may have a 32-bit prefix, while the highest CAM address or addresses may have less than 24-bit prefixes. If an incoming data pattern matches every bit within CAM word n, as well as every bit within, for example, CAM word 5, then CAM word n will be selected by priority encoder 460 as the top priority entry, since it resides at the lowest physical address. The matching entry output from priority encoder 460 may then be forwarded to multi-match extraction logic 470 before the matching entry is forwarded to an associated data storage device (e.g., an associated SRAM or DRAM) via output port 480.

As noted above, some applications may benefit from locating and extracting a plurality of database entries matching a given search key. To enable such extraction, multi-match extraction logic 470 may be included within CAM device 400. As shown in FIG. 4, multi-match extraction logic 470 may be coupled for receiving a search key and one or more control signals (CNTL) from an upstream processing device. The search key and control signals may be received at input port 410. Multi-match extraction logic 470 may also be coupled for receiving the matching entries selected by and output from priority encoder 460. As described in more detail below, multi-match extraction logic 470 may be generally configured for using the search key to locate an initial matching entry, and thereafter, for producing a set of modified search keys 420. The modified search keys may then be used for locating and extracting a number of additional matching entries from the database. The control signals may be used to determine the number of matching entries and/or the order in which the matching entries are to be extracted from the database. In some cases, the control signals may also be used to determine the order in which the entries are initially stored within the database.

Though multi-match extraction logic 470 is shown in FIG. 4 as included within CAM device 400, multi-match extraction logic 470 may be coupled between the input and output ports of CAM device 400, in alternative embodiments of the invention. Regardless of whether multi-match extraction logic 470 is included within a processing device (FIG. 3), a CAM device (FIG. 4), or another apparatus coupled therebetween (not shown), multi-match extraction logic 470 is uniquely configured for locating and extracting multiple entries matching a single search key and one or more variations thereof.

Figure 5:
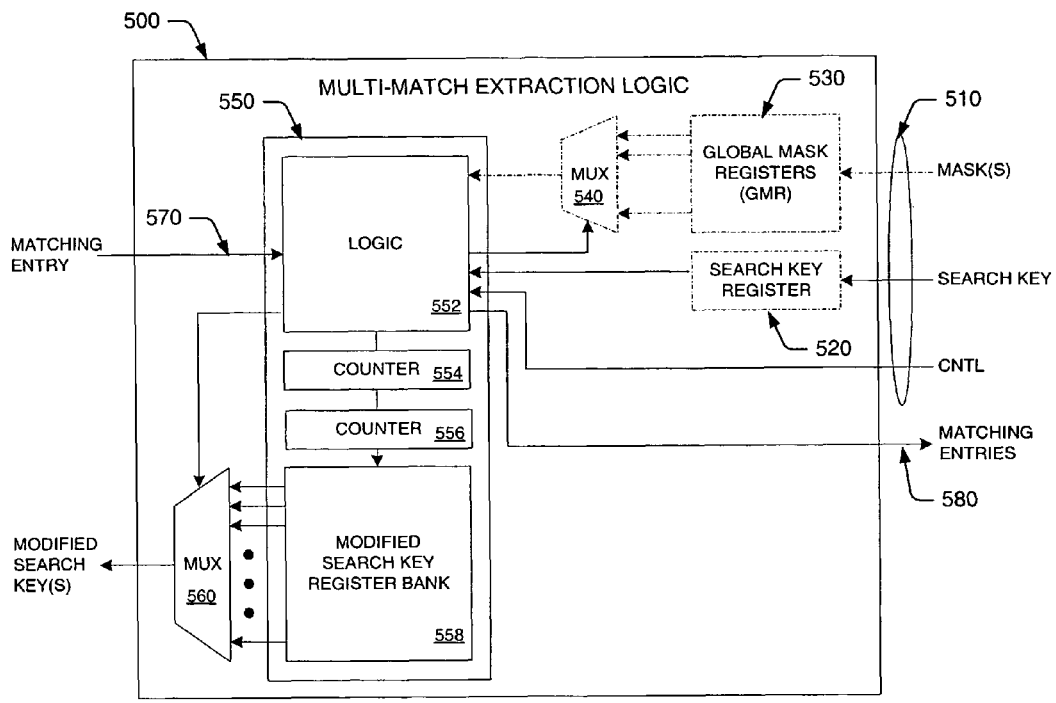
FIG. 5 is a block diagram illustrating one embodiment of the multi-match extraction logic shown in FIGS. 3 and 4.

FIG. 5 illustrates multi-match extraction logic 370/470 as simplified circuit diagram 500. As shown in FIG. 5, circuit 500 may include one or more input conductors 510 for receiving a search key and one or more control signals (CNTL). If data is to be written to the CAM device, however, input conductor(s) 510 may receive the data in lieu of a search key. During a search operation, a search key generator 550 may receive the search key and the one or more control signals. The search key generator 550 may be generally configured for producing a set of modified search keys after an initial matching entry has been found using the search key. The set of modified search keys may be related to the search key and the initial matching entry, and thus, may be considered "variations of the single search key" received by circuit 500.

As shown in FIG. 5, search key generator 550 may include logic block 552, counter 554, counter 556 and register bank 558. Counter 554 may be used for counting the number of matching entries that are found while using the search key and the variations thereof, whereas counter 556 may be used for counting the number of modified search keys remaining in the set. Register bank 558 may be used for storing the set of modified search keys corresponding to the search key and the initial matching entry. Multiplexer 560 may also be included within circuit 500 for selectively outputting the set of modified search keys stored within register bank 558. For example, multiplexer 560 may be configured for outputting the set of modified search keys one at a time, several at a time, or all at a time. If more than one of the set of modified search keys are output at once, they may be used to increase search speed, e.g., by searching multiple copies of the database in parallel.

In general, logic block 552 may include a number of logic components, which when coupled together in a particular manner, function to produce the set of modified search keys after an initial matching entry has been located and extracted from a database of entries. As such, logic block 552 may include any number and/or configuration of logic components that are capable of receiving an initial matching entry and using at least a portion of the initial matching entry, along with the original search key, to produce the set of modified search keys. An exemplary method for producing the set of modified search keys will be described below in reference to FIG. 10.

In some embodiments of the method, however, a location (e.g., an address or index) of an initial matching entry may be used for limiting subsequent search operations to those entries residing above or below the location of the initial matching entry. For example, if an initial matching entry is found at memory location 0110 (i.e., location 6), one or more of the modified search keys may be used for limiting subsequent searches to the entries residing within memory locations 0000-0101 (i.e., locations 0-5). Each of the modified search keys may be produced by appending a binary sequence of one of the searchable memory locations to the original search key. For example, binary sequences 0000, 0001, 0010, 0011, 0100, and 0101 may each be appended to the original search key to produce the set of modified search keys. The original search key may be temporarily stored within search key register 520.

In some embodiments, circuit 500 may include one or more global masking registers (GMRs) 530 to assist logic block 552 in producing the set of modified search keys. For example, frequently used masking patterns may be stored within the GMRs and selectively applied to the location of the initial matching entry to reduce the number of modified search keys needed to cover the remaining search space. In some cases, frequently used masking patterns may be pre-loaded into GMRs 530 to increase throughput by eliminating an extra write operation during searching. In other cases, one or more of GMRs 530 may be dynamically written at the time of searching. In either case, software may be provided to determine whether a particular global mask is already present with GMRs 530, or if an additional write command should be issued to set one up. When used, GMRs 530 may reduce the number of modified search keys by replacing one or more bits in the binary sequences of the searchable memory locations with "don't care" bits. For example, the contents of GMRs 530 may be selectively applied to the location of the initial matching entry (e.g., location 6), such that locations 4-5 (corresponding to binary sequence 010x) and locations 0-3 (corresponding to binary sequence 00xx) are searched using 2 instead of 5 modified search keys. Multiplexer 540 may be used for selecting the particular masking registers to be applied.

Though search key register 520, GMRs 530, and multiplexer 540 are included within the multi-match extraction logic of FIG. 5, registers 520, 530, and multiplexer 540 may not be necessary in all embodiments of the invention. In some embodiments, fewer global masking registers, or even no global masking registers, may be required depending on the particular manner in which the set of modified search keys are produced. The use of global masking registers may be preferred in applications that benefit from reducing the number of search operations needed for locating and extracting a number of additional matching entries. However, global masking registers may be reduced (or even eliminated) if one wishes to reduce the complexity of the extraction logic and/or utilize memory devices that do not support masking features (e.g., binary CAMs). In some cases, the number of global masking registers used by the multi-match extraction logic may be reduced if one or more of the GMRs are needed for other purposes.

In addition to producing the set of modified search keys, logic block 552 may be configured for determining the manner in which the database entries are stored in memory, the number of database entries to be located and extracted with a single search key, and in some cases, the order in which the entries are to be extracted. For these purposes, logic block 552 may be configured for receiving one or more control signals (CNTL) from an upstream processing device. The appropriate control signals may be determined by a software program running on the processing device (e.g., multi-match extraction software 380 of FIG. 3), or alternatively, by a user interacting with the software program.

The manner in which the database entries are stored, as well as the number and order in which the entries are to be extracted from the database, may be dependent on several factors including, but not limited to, the type of database to be stored, the application performing the search operation, the desired search rate and the number of masking registers available. For example, routing and forwarding tables may be stored in the order of prefix length, with longer prefix entries residing at lower memory addresses and shorter prefix entries residing at higher memory addresses (or vice versa). Thus, if one wishes to update a routing or forwarding table with changes made to a particular destination address, a search operation may be performed to locate and extract all table entries matching the particular destination address.

In any case, logic block 552 may initialize counter 554 with the number of entries to be extracted from a database of entries. Though counter 554 may be initialized at substantially any time, initialization is preferably performed before the first modified search key is output from circuit 500 for locating and extracting additional matching entries. Upon receiving each matching entry, counter 554 will increment (or decrement) the count stored therein to track the number of matching entries extracted from the database. After an initial matching entry is found and a first set of modified search keys is generated, logic block 552 may also initialize counter 556 with the number of modified search keys in the set. Counter 556 will then increment (or decrement) the count stored therein to track the number modified search keys that are used in the set. In some cases, counter 556 may be initialized with a new count if a newly located matching entry causes a new set of modified search keys to be generated before (or after) the original set of modified search keys have been exhausted.

Referring to FIGS. 4 and 5, each of the matching entries may be sent from priority encoder 460 and received by logic block 552 via input conductor 570. As described in more detail below, matching entries may be extracted until counter 554 indicates that the predetermined number of matching entries has been extracted or the set of modified search keys have all been used (as indicated by counter 556). As noted above, the matching entries may be forwarded from circuit 500 (via output port 580) to an associated memory device (e.g., a SRAM or DRAM) containing data associated with the matching entries. The matching entries may be forwarded as each matching entry is received by circuit 500, or in some cases, after the predetermined number of matching entries have been located and extracted from the memory device.

Figure 6:
FIG. 6 is a block diagram of a conventional search key (or database entry) that may be sent to (or stored within) a CAM device, where in addition to the search key (or index) portion, the conventional search key (or database entry) includes a valid field portion containing a number of valid bits equal to the number of threads utilizing the CAM device.

FIGS. 7 and 8 illustrate exemplary ways in which the search keys and/or database entries sent to circuit 500 may be configured. FIG. 6 illustrates one manner in which search keys and database entries are conventionally configured. As shown in FIG. 6, a conventional search key (or database entry) 600 may include a valid field portion and a search key (or index) portion. In one example, the search key/index portion may correspond to a destination address to be updated within a routing or forwarding table. The valid field portion contains one or more bits, which may be stored along with each database entry (or index) to indicate whether or not that database entry contains a "valid entry." A matching entry may be found when the valid and search key portions of an issued search key match the valid and index portions of a particular database entry.

Unfortunately, search key/database entry 600 cannot be used in many of today's multi-threaded processors, since the number of valid bits within search key/database entry 600 must equal the number of processing threads granted access to the database. Though a small number of valid bits (e.g., up to 8) may provide a viable solution for some processing devices, the number of valid bits that would be required in many of today's packet processors (e.g., up to 128) would prohibit the use of conventional search key/database entry 600 and any circuitry directly associated therewith.

FIGS. 7 and 8 differ from conventional search keys/database entries (FIG. 6) by avoiding the use of a valid bit field, or any bit field dependent on the number of threads having access to a database. As shown in FIG. 7, search key/database entry 700 may include a descriptor field portion and a search key/index portion. FIG. 8 illustrates an embodiment in which more than one descriptor field portion is included within a search key/database entry 800. Unlike the conventional embodiment of FIG. 6, the descriptor field(s) of search keys/database entries 700 and 800 may include a number of bits (e.g., N1 and N2), which do not depend on the number of threads accessing the database. Instead, the number of bits within the descriptor field(s) may depend on other factors including, but not limited to, the size and type of the database, the data included within the descriptor field(s), the application performing the search operation, the desired search speed and the number of masking registers available.

For example, a database of size N may be stored in substantially any order (e.g., randomly, in the order of prefix length, etc.). In some embodiments, the N number of database entries may be counted as they are being stored, so that a unique count or "offset value" may be stored within a descriptor field portion of each database entry. In some cases, the number of bits needed for storing the unique counts may be equal to $W=\log(N)$. In other words, for a database of approximately 65 to 128 entries, an 8-bit wide descriptor field may be used for storing a unique offset value within each of the database entries. In other embodiments, the size of the descriptor field may be reduced by storing the number of bits within a most significant portion of the database entries. For example, a 4-bit wide descriptor field (i.e., 1000) may be used for storing the length of a prefix entry containing 8 bits (e.g., 10001101). Such a descriptor field may, therefore, be configured for storing a prefix entry length.

The type of data stored within the descriptor field(s) typically depends on the type of data stored within the database entries. For example, offset values may be stored along with ACL table entries, whereas prefix entry lengths may be stored along with routing and/or forwarding table entries. Other characteristics of database entries may be used as descriptors for different types of tables. For example, any categorical value specific to a particular database may be used in place of, or in addition to, the offset values and prefix entry lengths mentioned herein. As shown in FIG. 8, multiple descriptor fields may sometimes be used to achieve better performance by reducing the number of searches needed to cover the search space remaining after at least one search is performed.

Figure 9:
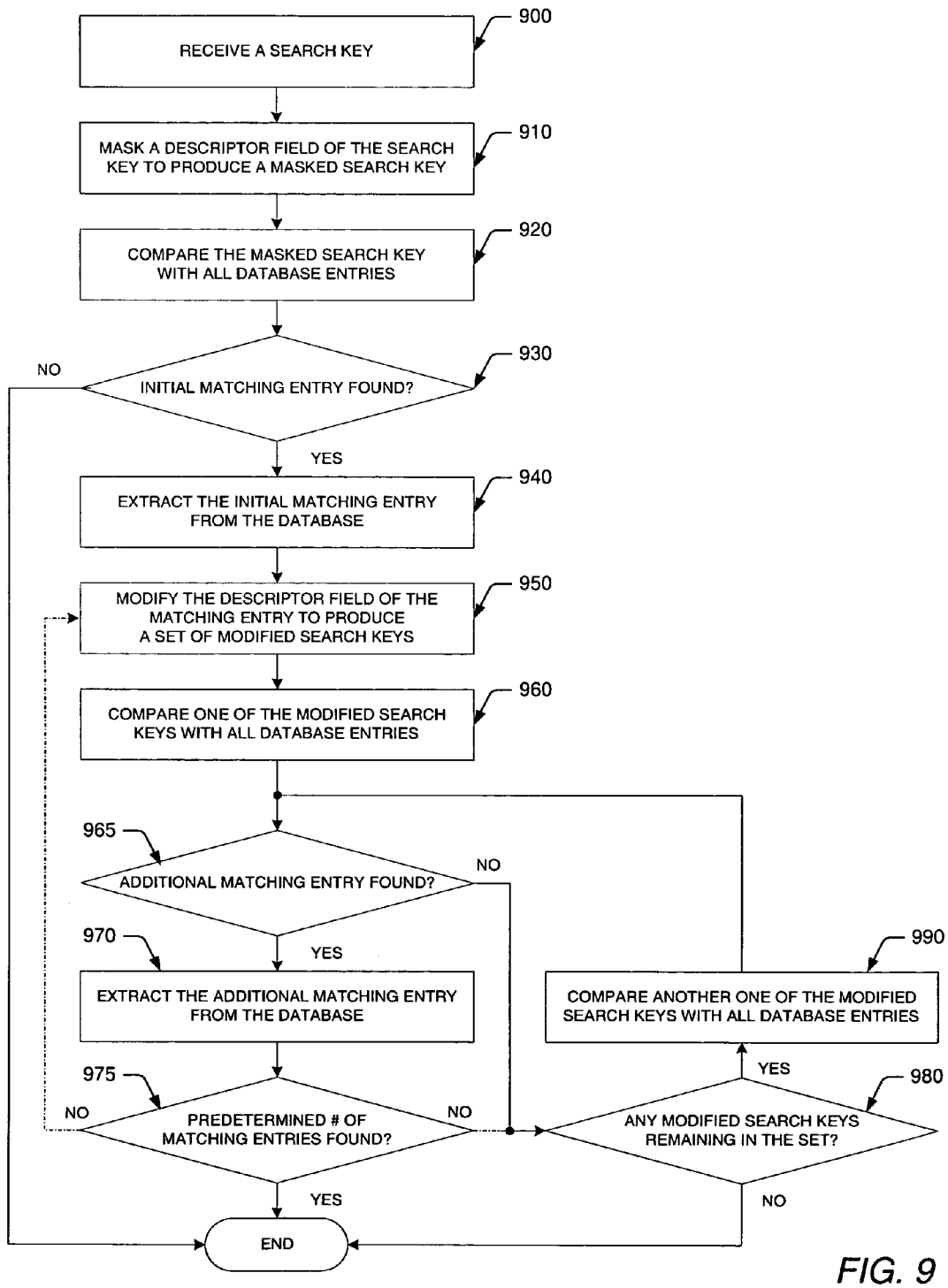
FIG. 9 is a flow chart diagram of a method for locating and extracting a plurality of matching entries from a database of entries stored within a CAM device, according to one embodiment of the invention.

Methods for Locating and Extracting a Plurality of Matching Entries by Comparing Variations of a Single Search Key to a Database of Entries FIG. 9 illustrates one embodiment of a method that may be used for locating and extracting a plurality of matching entries from a database of entries stored within a CAM device. In general, the method described herein may be used for extracting a potentially unlimited number of CAM entries matching a single search key. This may enable the method to be used in modern applications, which may require 'k' matching entries, the first 'k' matching entries, or all entries matching a particular search key to be extracted from a CAM device. Unlike conventional methods, the method described herein may be equally applied to single-threaded and multi-threaded systems with substantially any number of threads.

In some embodiments, the method may begin by receiving a search key, as shown in step 900 of FIG. 9. The search key may be sent from an upstream processing device (e.g., LCPU 300 or HCA 320 of FIG. 3). In some embodiments, the search key may be received by one or more CAM devices (e.g., CAM device 400 of FIG. 4). In other embodiments, the search key may be received by an apparatus (e.g., HCA 320 of FIG. 3) coupled between the upstream processing device (e.g., LCPU 300 of FIG. 3) and the one or more CAM devices (included within, e.g., NSE 350 of FIG. 3).

Regardless of the particular device receiving the search key, a number of steps may be performed prior to or during the initial step shown in FIG. 9. For example, one or more descriptor fields may be stored along with each of the database entries before the search key is received. As mentioned above, the descriptor field(s) may contain a unique offset value, a prefix entry length, or any other characteristic of the particular database stored within the one or more CAM devices. As described in more detail below, the descriptor field(s) may be used to limit the set of entries that may return a positive match and, therefore, guarantee that the same matching entries are not repeatedly extracted.

In some cases, the method may also designate a predetermined number of matching entries to be extracted from the database. The predetermined number may or may not depend on the search key received in step 900, and therefore, may or may not be designated before the search key is received. For example, the method may determine (before or after receiving the search key) that 'k' number of entries are to be extracted from the database. If the database contains a total of N number of entries, the 'k' number of entries to be extracted may be as little as 2, or as many as N entries. The method may also designate an order in which the matching entries are to be extracted from the database. For example, the method may determine that the first 'k' number of entries should be extracted.

In some embodiments, after the search key is received in step 900, the method may use the search key for locating and extracting an initial matching entry. For example, a descriptor field of the search key may be masked out to produce a masked search key (in step 910). If the received search key already contains a descriptor field, the bits pertaining to the descriptor field are replaced with "don't care" bits; otherwise, a corresponding number of "don't care" bits are appended to the search key to produce the masked search key. In step 920, the masked search key is compared against each of the database entries for locating an initial matching entry. The method may end, if an initial matching entry cannot be found (in step 930). However, if an initial matching entry is found (in step 930), the initial matching entry is extracted from the database (in step 940), and a descriptor field of the initial matching entry is modified to produce a set of modified search keys (in step 950). An exemplary method for producing the set of modified search keys will be described below in reference to FIG. 10.

However, steps 910-940 are not necessarily performed in all embodiments of the invention. In other words, though a search key may still be received in step 900, there may not be a need for locating and extracting an initial matching entry (steps 910-940) before a set of modified search keys are produced in step 950. Instead, a starting point for the search may be designated within a descriptor field portion of the search key. The starting point may be used to produce the set of modified search keys in lieu of the descriptor field portion of an initial matching entry.

Regardless of how the set of modified search keys are produced, the set of modified search keys may be used for locating and extracting additional entries matching the original search key. In some embodiments, the set of modified search keys may be used one at a time for searching the database entries (in step 960). Though all entries within the database will be searched, the modified descriptor field places a logical constraint on the search by limiting the set of entries which can return a matched result. In other words, the modified descriptor field logically constrains the search to only those entries, which have not yet returned a matching entry.

If an additional matching entry is not found with the first modified search key (in step 965), the method may determine whether any modified search keys remain within the set (in step 980). If not, the method ends; if so, another one of the modified search keys may be used for searching the database (in step 990) and the method may return to step 965. If an additional matching entry is found (in step 965), the additional matching entry is extracted from the database (in step 970). In some embodiments, steps 990, 965 and 970 may be repeated until a predetermined number of matching entries have been found (in step 975) or the set of modified search keys have all been used (in step 980).

In other embodiments, however, a new set of modified search keys may be produced after each additional matching entry has been located and extracted (see, the dotted line from box 975 to box 950). The new set of modified search keys may be used for locating additional matching entries within memory locations close to the location in which a matching entry has just been found. In other words, each 'hit' or matching entry may allow the method to gradually converge on the search space most likely to include additional matching entries. In some cases, the new set of modified search keys may be used before returning to the original set of modified search keys. In other cases, however, the original set of modified search keys may be exhausted, and if the predetermined number of matching entries have not yet been found, a new set of modified search keys may be produced—based on a matching entry found with one of the original set—and used for searching remaining portions of the search space.

The following calculation may be used for estimating a worst case number of searches that may be issued for extracting 'k' number of matching entries. For a database of size N, the number of bits needed in the descriptor field may be W=log(N) for storing all offset values, or W=log(L) for storing all prefix or offset value lengths (where L represents the greatest descriptor field length). Thus, the number of modified search keys that may be produced after finding an initial matching entry can be no more than W. In other words, a second extraction may require up to W searches to be issued before an additional matching entry is located and extracted from the database. However, since each additional extraction may require one less search (at the very least), the worst case number of searches may be estimated as:

$$W+(W-1)+\ldots(W-k-2)+1=W-k/2+1 \qquad \text{EQ. 1}$$

For example, EQ. 1 states that approximately 6.5 searches may be issued for extracting k=5 matching entries from a database of N=128 entries. Since partial searches cannot be issued, the result may be rounded to the next highest integer (i.e., 6.5 is rounded to 7). However, the average number of searches may be much less when multiple matching entries are located in close-by indices of a table, or when alternative schemes are used (see below).

Methods for Producing a Set of Modified Search Keys

Figure 10:
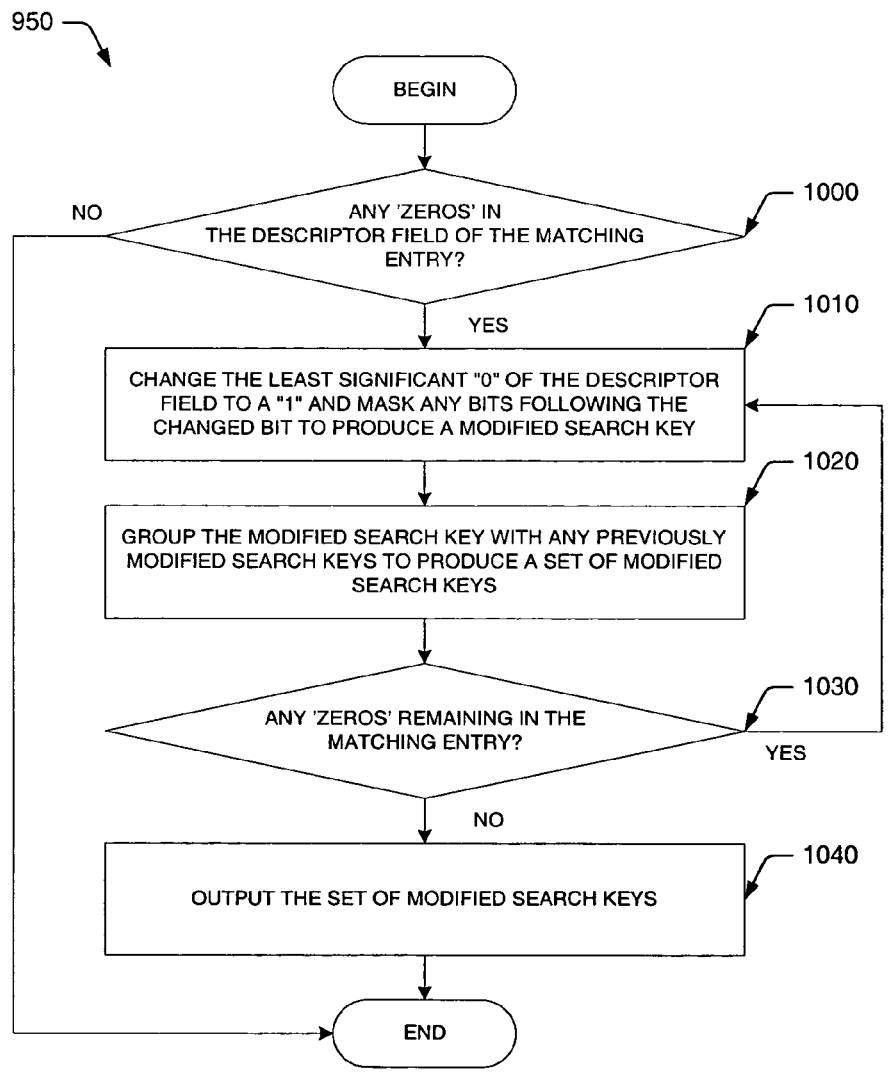
FIG. 10 is a flow chart diagram of a method for producing a set of modified search keys (box 950 of FIG. 9), according to one embodiment of the invention.

FIG. 10 illustrates one embodiment of a method that may be used for producing a set of modified search keys. In the method of FIG. 10, database entries may be stored in the order of prefix length and assigned a unique offset value. Database entries with longer prefix lengths may be assigned smaller offset values and stored within lower memory locations, while database entries with shorter prefix lengths may be assigned larger offset values and stored within higher memory locations. Once an initial matching entry is found at memory location 'j,' a set of modified search keys may be produced for limiting subsequent search operations to a range of database entries with offset values greater than the offset value stored at location Though all database entries are physically searched during the subsequent search operations, additional matching entries will only be found in memory locations greater than location 'j.' In addition to the initial matching entry, the method of FIG. 10 may also be used for producing a new set of modified search keys in response to one or more additional matching entries.

As shown in FIG. 10, the method may determine whether any zeros exist within the descriptor field of the initial (or additional) matching entry (in step 1000). If no zeros exist, the method may end. However, if at least one zero exists within the descriptor field, the least significant "0" bit may be changed to a "1" bit and any bits following the changed bit may be replaced with "don't care" bits to produce a modified search key (in step 1010). If no additional zeros remain within the descriptor field (in step 1030), the modified search key may be output for comparison (in step 1040). Otherwise, another modified search key may be produced by changing the next least significant "0" bit to a "1" bit and replacing any bits following the changed bit with "don't care" bits (in step 1010). The modified search key may be grouped with any previously modified search keys to produce a set of modified search keys (in step 1020). Steps 1010, 1020 and 1030 may be repeated until no zeros remain within the descriptor field of the initial matching entry; the set of modified search keys may then be output for comparison (in step 1040).

Figure 11A:
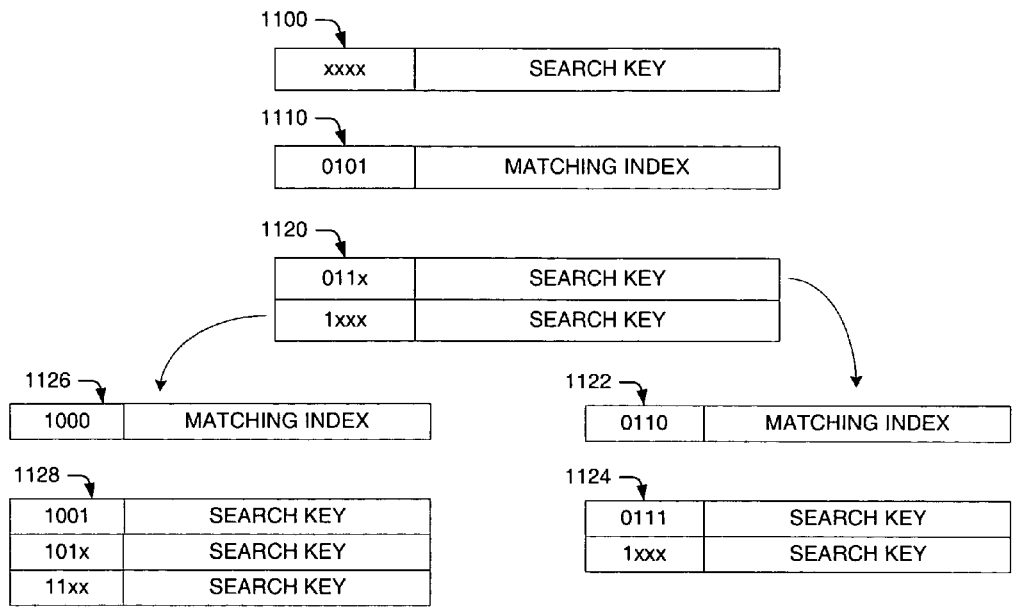
FIG. 11A is a block diagram illustrating an exemplary set of modified search keys that may be produced in accordance with the method of FIG. 10 after a matching entry is located and extracted with the search key or a variation thereof.

FIG. 11A is one example of an initial matching entry that may be located and extracted in accordance with the method of FIG. 9, and the set(s) of modified search keys that may be produced in accordance with the method of FIG. 10. As shown in FIG. 11A, the descriptor field of an original search key 1100 is masked out (i.e., replaced with "don't care" bits) for locating and extracting an initial matching entry 1110 from a database of entries. The descriptor field of the initial matching entry may then be modified for producing a set of modified search keys 1120. As noted above, the set of modified search keys may be used one at a time, several at a time, or all at once. In any case, the set of modified search keys may be used for limiting the range of database entries within which an additional matching entry may be found.

In FIG. 11A, the descriptor field of the initial matching entry contains an offset value of 0101 (i.e., binary 5). If the initial matching entry corresponds to the longest matching entry in the database, subsequent search operations may be performed for locating the next longest matching entry. In other words, a set of modified search keys can be produced for locating additional matching entries within database entries having offset values greater than 5 (if, e.g., the database entries are stored in a descending order of prefix length). As shown in FIG. 11A, two modified search keys, 011x and 1xxx, may be produced by applying the method of FIG. 10 to initial matching entry 1110. The first modified search key, 011x, may be used for locating additional entries, which match to the original search key and contain offset values of 6 or 7. If a predetermined number of matching entries has not been reached, the second modified search key, 1xxx, may be used for locating additional matching entries with offset values greater than 7.

In some embodiments, a new set of modified search keys may be generated if a matching entry is located with one or more of the original set of search keys. Assume, for example, that a matching entry 1122 is found when searching with the first modified search key, 011x. Since matching entry 1122 contains an offset value of 0110 (i.e., binary 6), a new set of modified search keys 1124 may be produced for locating additional entries matching the original search key and containing offset values of 7 or 8 (i.e., 0111 or 1xxx). The new set of modified search keys 1124 may or may not locate additional matching entries, which could then be used for generating yet another set of modified search keys. In some cases, a newly generated set of modified search keys may include a replica of a search key (e.g., 1xxx) included within the original set, or within another set of modified search keys. If this occurs, the replicated search key may be used only once to avoid repeatedly returning the same matching entry.

If the predetermined number of matching entries has not been reached, an additional matching entry 1126 may be found while searching with the second modified search key, 1xxx. In some cases, the second modified search key may be used before the first modified search key. In other words, the modified search keys may be used in substantially any order, as desired. In the embodiment of FIG. 11A, the offset value of matching entry 1126 is 1000 (i.e., binary 8). To search the remaining space, another set of modified search keys 1128 (containing, e.g., 1001, 101x and 11xx) may be produced for locating additional entries, which match the original search key and contain offset values greater than or equal to 9.

In some embodiments, the database entries may be split into a number of sub-databases, where each sub-database is assigned a descriptor field value and stored within a different portion of the CAM device. To locate a particular entry, the database may be represented as a hierarchical tree structure containing a plurality of nodes extending between a root node and a number of leaf nodes. In some cases, each of the sub-databases may be stored within one of the leaf nodes and assigned a unique offset value. Though individual database entries may be stored within the leaf nodes, in alternative embodiments of the invention, it may be desirable to group the entries into sub-databases, so as to reduce the number of leaf nodes required to represent the database.

Figure 12A:
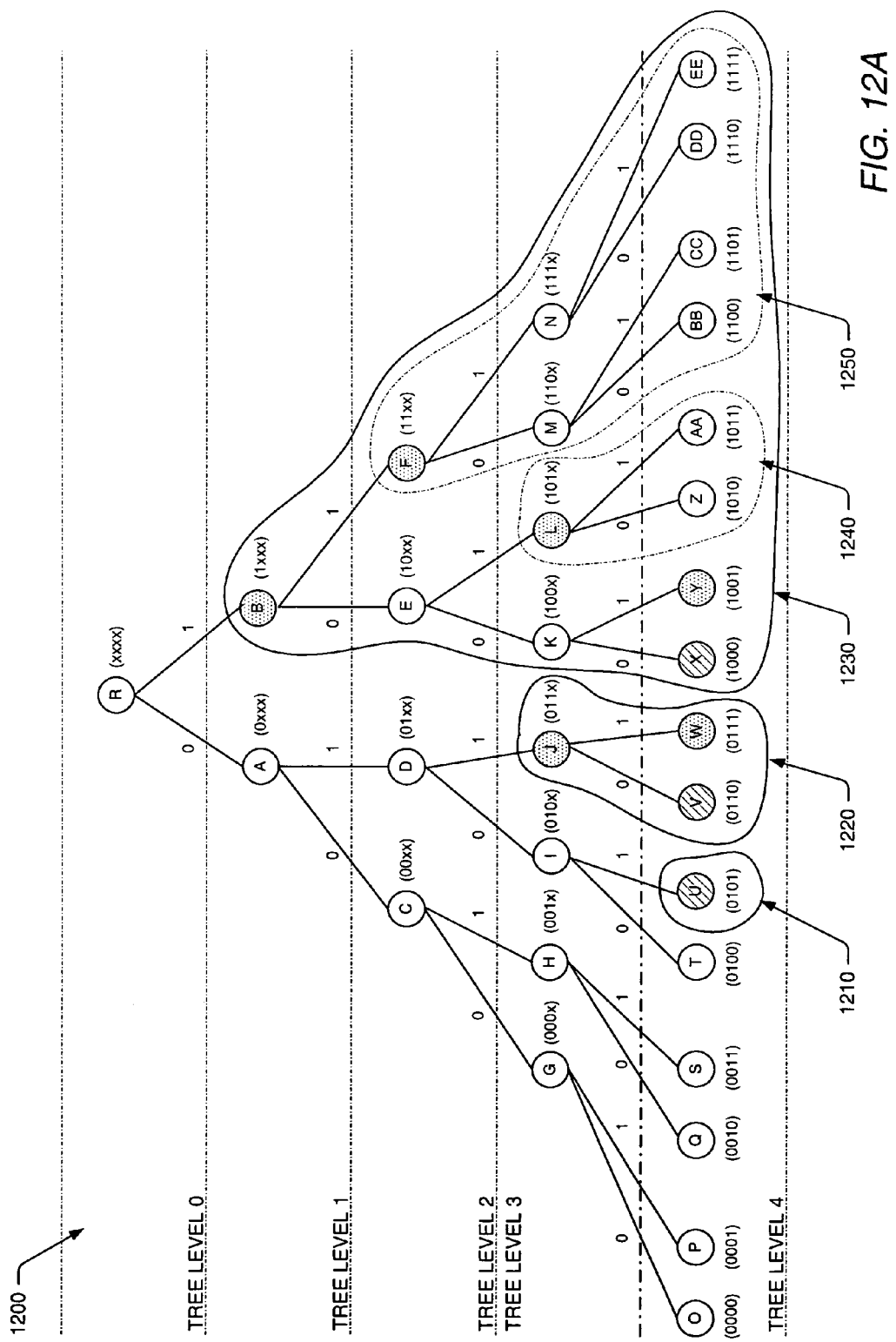
FIG. 12A is a plan diagram of an exemplary tree structure that may used for locating and extracting a plurality of matching entries from a database of entries, where the entries may be stored at the lowest level of the tree structure and assigned a unique descriptor field value (e.g., a unique offset value)

In tree structure 1200 of FIG. 12A, the database entries may be divided into sixteen sub-databases, each of which may be stored within one of the leaf nodes (designated as nodes O-EE) and assigned a unique offset value between 0000 and 1111. To search for an initial matching entry, a "0" or "1" branch may be followed from the root node (R) to the next node, or the next binary bit position, within the tree. The process may continue until an initial matching entry is found within a sub-database of one of the leaf nodes.

Referring to FIGS. 11A and 12A, an initial matching entry may be found within the sub-database 1210 of leaf node U. Because the sub-database of leaf node U contains an offset value of 0101 (i.e., binary 5), subsequent searches may be logically constrained to the sub-databases stored within leaf nodes V-EE, or the sub-databases containing offset values greater than 5. As noted above, subsequent search operations may be performed by comparing the modified search keys to each of the entries within the database. However, because the modified search keys correspond to particular nodes within the tree of FIG. 12A, additional matching entries may only be found within the sub-databases descending from those nodes. In other words, modified search key 011x de J) may be used for locating and extracting additional matching entries from the sub-databases 1220 stored within leaf nodes V and W. If a predetermined number of matching entries has not been reached, modified search key 1xxx (node B) may be used for locating and extracting additional matching entries from the sub-databases 1230 stored within leaf nodes X, Y, Z, AA, BB, CC, DD and EE.

As noted above, however, new sets of modified search keys may be generated in response to one or more of the additional matching entries. For example, if a matching entry is located within the sub-database of leaf node V, a new set of modified search keys, 0111 (node W) and 1xxx ((node B), may be produced for searching the sub-database of leaf node W, as well as leaf nodes X, Y, Z, AA, BB, CC, DD, and EE (if previous searches have not yet done so). If, however, a matching entry is located within the sub-database of leaf node X, another set of modified search keys, 1001 (node Y), 101x (node L) and 11xx (node F), may be produced for searching the sub-databases of leaf nodes Y, Z, AA, BB, CC, DD, and EE (if previous searches have not yet done so).

Alternative Embodiments of the Invention

In one alternative embodiment of the invention, the method of FIG. 10 may be modified when database entries are stored in the order of prefix length and assigned a prefix entry length. For example, the method may produce a set of modified search keys by repeatedly changing the least significant "1" bits to "0" bits and replacing any bits following the changed bit with "don't care" bits. Thus, once an initial matching entry is found at memory location 'j,' a set of modified search keys may be produced for limiting subsequent search operations to the database entries with shorter prefix lengths than the length of the entry stored at location 'j'. Though all database entries are physically searched during the subsequent search operations, additional matching entries may only be found in memory locations less than location 'j.'

Figure 11B:
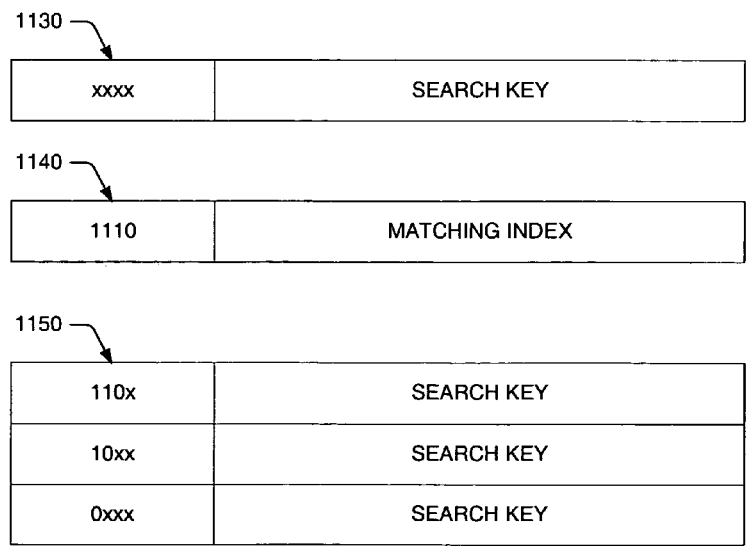
FIG. 11B is a block diagram illustrating an exemplary set of modified search keys that may be produced in accordance with a modified version of the method of FIG. 10.

FIG. 11B is an example of an initial matching entry that may be located and extracted in accordance with the method of FIG. 9, and the set of modified search keys that may be produced in accordance with the alternative method of FIG. 10. As shown in FIG. 11B, masked search key 1130 may be used for locating and extracting an initial matching entry 1140 from a database of entries. The descriptor field of initial matching entry 1140 may contain, for example, a prefix length of 1110 (i.e., binary 14). If the initial matching entry corresponds to the longest matching entry in the database, and the database entries are stored in a descending order of prefix length, a set of modified search keys 1150 may be produced for locating the next longest matching entry. As shown in FIG. 11B, three modified search keys, 110x, 10xx and 0xxx, may be produced by applying the alternative method of FIG. 10 to initial matching entry 1140. A method for locating the next longest matching entry may now be described in the context of a hierarchical tree structure, such as the one shown in FIG. 12B.

Figure 12B:
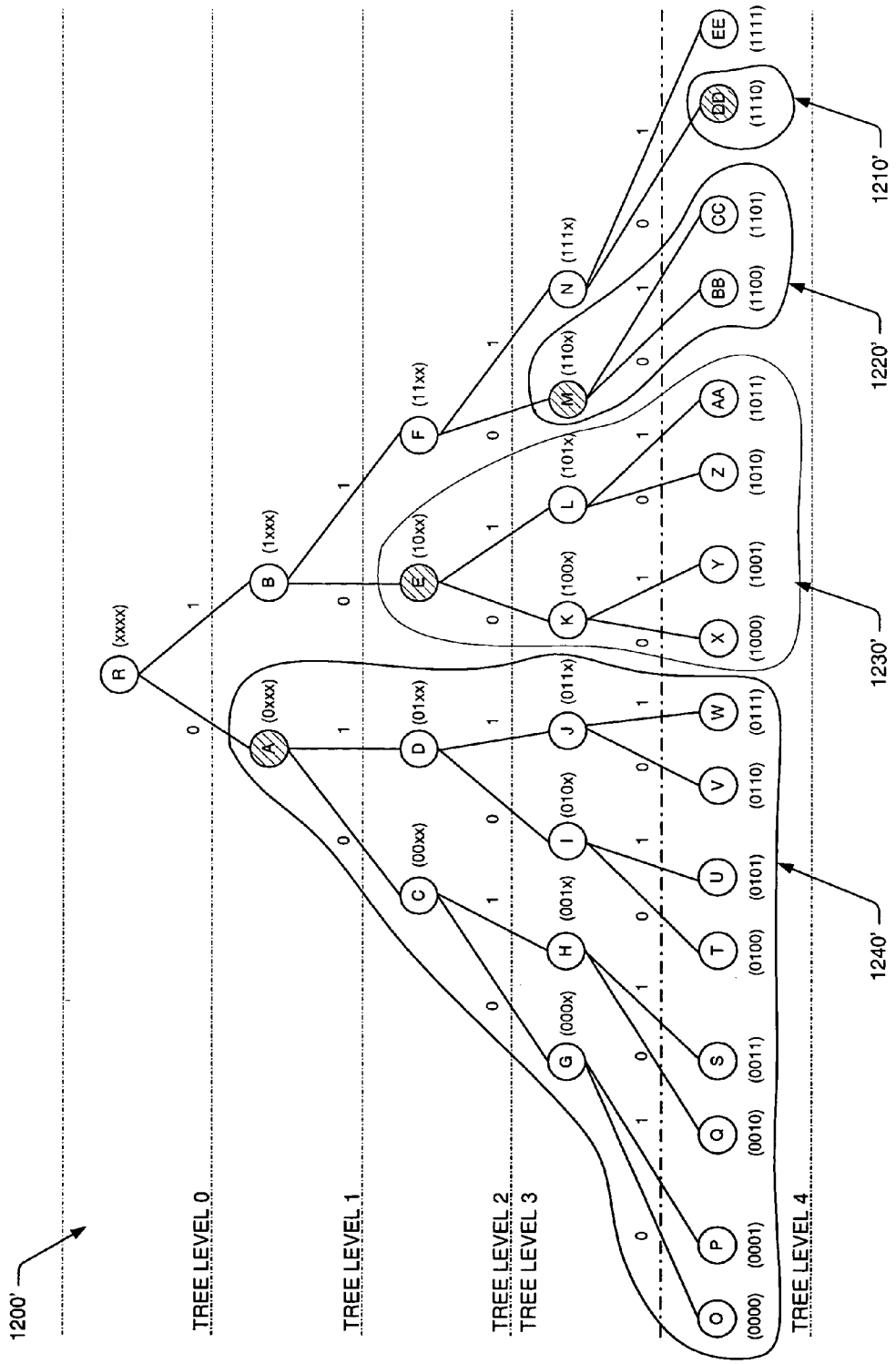
FIG. 12B is a plan diagram of another exemplary tree structure that may used for locating and extracting a plurality of matching entries from a database of entries, where the entries may be stored at the lowest level of the tree structure and one or more of the entries may be assigned a common descriptor field value (e.g., a common prefix length).

As shown in FIG. 12B, each of the database entries (or sub-databases) may be stored within one of the sixteen leaf nodes (designated as nodes O-EE) mentioned above. A unique prefix length value may also be assigned to each of the leaf nodes. Since more than one database entry may share the same prefix length, the current method may be used to reduce the size of the hierarchical tree structure, and in some cases, to reduce the number of bits needed in the descriptor field. To search for an initial matching entry, a "0" or "1" branch may be followed from the root node (R) to the next node, or the next binary bit position, within the tree. The process may continue until an initial matching entry is found within a sub-database of one of the leaf nodes. If the database entries are stored in a descending order of prefix length, a next longest matching entry may be located by searching portions of the tree with substantially shorter prefix lengths than the prefix length of the initial matching entry.

Referring to FIGS. 11B and 12B, an initial matching entry may be found within leaf node DD. Because the descriptor field of leaf node DD (i.e., 1110) contains a prefix length of 14, subsequent searches may be logically constrained to leaf nodes O-CC by searching leaf nodes with increasingly shorter prefix lengths. In other words, a first modified search key, 110x, (node M of tree level 3) may be used for locating and extracting additional matching entries from leaf nodes BB and CC. If a predetermined number of matching entries has not been reached, a second modified search key, 10xx, (node E of tree level 2) may be used for locating and extracting additional matching entries from leaf nodes X, Y, Z and AA. If the predetermined number has still not been reached, a third modified search key, 0xxx, (node A of tree level 1) may be used for locating and extracting additional matching entries from leaf nodes O, P, Q, S, T, U, V and W. Though not shown in FIGS. 11B and 12B, a new set of modified search keys may be produced upon locating each new additional matching entry, if so desired.

In another alternative embodiment, a method may be used for reducing the number of searches needed to locate and extract the 'k' number of matching entries. Instead of searching the modified search keys one at a time, for example, a plurality of the modified search keys may be searched at the same time. To do so, an additional descriptor field may be used for storing a flag, which would be set (e.g., to a "1" bit) for a particular database entry, if the offset value of that entry is greater than the offset value of the last matching entry found. Assume, for example, that the last search operation located a matching entry at location 'I,' and that the least significant bits of the offset value stored within location 'i' are "00." In such an example, the additional descriptor field may be set within a particular database entry, if the least significant bits of the entry's offset value are greater than "00". (i.e., if the least significant bits are 01, 10 or 11). The number of searches can then be reduced by masking the least significant bits of the search key, but specifying that the additional descriptor field must contain a set bit. When the least significant bits are replaced two at a time, the number of searches needed for extracting the 'k' number of matching entries can be reduced by half. In some cases, more than two least significant bits may be replaced at a time to further reduce the number of searches needed for extracting the 'k' number of matching entries. The flag stored within the additional descriptor field may also be set, in other embodiments, if the prefix length of a particular database entry is less than the prefix length of the last matching entry found.

Other methods may be used for reducing the number of searches needed for locating and extracting the 'k' number of matching entries. For example, multiple descriptor fields may be used, as shown in FIG. 8. The descriptor fields may be populated with different types of data to reduce the overall number of searches needed for covering the remaining search space. In another example, a multi-threaded packet processor may be used for simultaneously searching the database. Each thread may issue searches based on a result obtained from a previous search, or may predictively search portions of the database to speed up the search operation. In either case, different heuristics may be used for selecting the next search to be issued. For instance, a previous search may be issued for locating the first 'k' number of matching entries. After one or more matching entries are located, subsequent searches may be issued for locating all of the entries matching a modified search key.

In another alternative embodiment, a method may be used for reducing the number of global masking registers needed to produce the set of modified search keys. In one example, the number of global masking registers may be reduced by not allowing the most significant 'm' number of bits in the descriptor field to be modified. In other words, only the least significant 'W−' number of bits in the descriptor field may be modified in accordance with the method of FIG. 10 to produce a set of modified search keys. However, an additional $2^m$ number of searches may be issued to cover the search space of the unmodified 'm' number of bits. Though this method ultimately increases the number of searches needed to cover the search space, the number of global masking registers required to execute such a method may be reduced from about 3/2*W to about 3/2*(W−m). Therefore, if 2 out of 8 descriptor field bits are excluded from modification, the number of global masking registers may be reduced from about 12 to 9.

Other methods may be used for reducing the number of global masking registers needed to produce the set of modified search keys. In some cases, the method of FIG. 10 may be modified such that two or more of the least significant descriptor field bits are changed at a time to produce a modified search key. For example, if the two least significant bits of a descriptor field are "00," three modified search keys may be produced by changing the two least significant bits to "01", "10," and "11." Additional modified search keys may be produced by changing the next set of least significant bits (e.g., "10") to one or more greater binary values (e.g., "11") and replacing any descriptor field bits following the changed bits with "don't care" values. Though the current method may lead to a greater number of searches, the number of global masking registers may be reduced by the number of unmasked bits. In other words, if 2 out of 8 descriptor field bits are left unmasked, the number of global masking registers may be reduced from about 12 to about 10.

In some cases, global masking registers may be eliminated altogether by performing a linear search operation within the remaining search space after at least one matching entry is located. For example, if an initial matching entry is found at memory location 0110, a set of modified search keys may be produced for limiting subsequent searches to the entries residing within memory locations 0000-0101. To eliminate the need for global masking registers, binary sequences 0000, 0001, 0010, 0011, 0100, and 0101 may each be appended to the original search key to produce the set of modified search keys.

It will be appreciated to those skilled in the art having the benefit of this disclosure that this invention is believed to provide a circuit and method for locating and extracting a plurality of matching entries from a database. The plurality of entries may be located by comparing variations of a single search key to the entire database of entries. Further modifications and alternative embodiments of various aspects of the invention will be apparent to those skilled in the art in view of this description. For example, though the invention has been described in the context of a networking application, the invention is not limited to such, and can be applied to substantially any database-related application. It is, therefore, intended that the following claims be interpreted to embrace all such modifications and changes. In addition, the specification and drawings are to be regarded in an illustrative rather than a restrictive sense.

What is claimed is:

1. An apparatus comprising:
   a content addressable memory (CAM) array including a plurality of rows of CAM cells for storing a plurality of entries;
   input circuitry to receive a search key, wherein the search key identifies an initial matching entry in the CAM array during an initial compare operation between the search key and the plurality of entries stored in the CAM array; and
   a search key generator to generate a first set of modified search keys based on a modification of a portion of the initial matching entry output from the CAM array, wherein the modified search keys identify one or more additional matching entries in the CAM array during subsequent compare operations in the CAM array wherein each entry in the CAM array includes a descriptor field value that is used to generate the modified search keys.

2. The apparatus of claim 1, wherein the search key generator is configured to identify the additional matching entries in the CAM array until a predetermined number of matching entries are identified.

3. The apparatus of claim 2, wherein the search key generator further comprises:
   circuitry to generate a new set of modified search keys based on the storage location of one of the additional matching entries in the CAM array.

4. The apparatus of claim 1, wherein the modified search keys are generated in response to a starting address location of the initial matching entry.

5. A circuit comprising:
   a content addressable memory (CAM) array including a plurality of rows for storing a plurality of entries;
   an input circuit to receive a search key; and
   a logic block configured to (i) modify the search key after at least one matching entry is identified in the CAM array during an initial compare operation in the CAM array to generate a set of modified search keys and (ii) using one or more of the modified search keys to identify additional matching entries during subsequent compare operations in the CAM array wherein each entry in the CAM array includes a descriptor field value that is used to generate the modified search keys.

6. The circuit of claim 5, wherein the CAM array is incorporated within a CAM device.

7. The circuit of claim 5, wherein the circuit further comprises:
   a set of registers for storing the search key and the set of modified search keys;
   a first counter for counting the number of matching entries identified in the CAM array; and
   a second counter for counting the number of modified search keys used in compare operations in the CAM array.

8. The circuit of claim 7, wherein the logic block is further configured for identifying the additional matching entries in the CAM array until a predetermined number of matching entries are identified.

9. The circuit of claim 8, wherein the circuit further comprises one or more global mask registers, which are used by the logic block to generate each of the modified search keys by replacing one or more bits within a descriptor field portion of the initial matching entry with masked bits to generate a modified descriptor field portion and appending the modified descriptor field portion to the search key.

10. A method comprising:
    receiving a search key;
    comparing the search key with a plurality of entries stored in a content addressable memory (CAM) array during an initial compare operation to identify an initial matching entry in the CAM array;
    producing a first set of modified search keys by modifying one or more bits within a descriptor field portion of the initial matching entry output from the CAM array; and
    using one of the first set of modified search keys to identify an additional matching entry in the CAM array during a subsequent compare operation in the CAM array Producing a second set of modified search keys by modifying one or more bits within a descriptor field portion of the additional matching entry; and Using one of the second set of modified search keys for identifying an additional matching entry in the CAM array.

11. The method of claim 10, wherein the method further comprises repeating the step of using one of the first set of modified search keys until a predetermined number of matching entries are identified in the CAM array.

12. The method of claim 10, wherein the method further comprises repeating the step of using one of the second set of modified search keys before repeating the step of using one of the first set of modified search keys.

13. The method of claim 10, wherein prior to the step of receiving a search key, the method further comprises designating a predetermined number of matching entries to be extracted from the CAM array.

14. The method of claim 13, wherein prior to the step of receiving a search key, the method further comprises designating an order in which the matching entries are to identified in the CAM array.

15. The method of claim 10, wherein prior to the step of receiving a search key, the method further comprises dividing the CAM array entries into a plurality of sub-databases, wherein each sub-database is assigned a descriptor field value and stored within a different portion of the CAM array.

16. The method of claim 15, wherein the method further comprises storing an offset value within the descriptor field portion of each CAM array entry, wherein the offset values are produced by counting the number of sub-databases and assigning a unique count to each sub-database of entries.

17. The method of claim 16, wherein the step of producing a first set of modified search keys comprises:

changing the least significant "0" bit in the descriptor field portion of the initial matching entry to a "1" bit;

replacing any descriptor field bits following the changed bit with masked bits to produce one of the modified search keys; and repeating the steps of changing and replacing until no more "0" bits remain in the descriptor field portion of the initial matching entry.

18. The method of claim 15, wherein the method further comprises storing prefix length values within the descriptor field portion of each CAM array entry.

19. The method of claim 18, wherein the step of producing a first set of modified search keys comprises:

changing the least significant "1" bit in the descriptor field portion of the initial matching entry to a "0" bit;

replacing any descriptor field bits following the changed bit with masked bits to produce one of the modified search keys; and repeating the steps of changing and replacing until no more "1" bits remain in the descriptor field portion of the initial matching entry.

20. The method of claim 15, wherein prior to the step of receiving a search key, the method further comprises storing a second descriptor field value within an additional descriptor field portion of each CAM array entry.

21. The method of claim 15, wherein prior to the step of receiving a search key, the method further comprises reducing a number of bits that can be masked within the descriptor field portion of each CAM array entry.

22. The apparatus of claim 1, wherein the modified search keys are generated by modifying a first portion of the initial matching entry and combining the modified first portion with the search key.

23. The apparatus of claim 1, wherein the CAM array comprises a content addressable memory (CAM) device.

24. The apparatus of claim 5, wherein the CAM array entries comprise forwarding addresses, and descriptor field values each comprise a prefix length of the corresponding forwarding address.

25. A Content Addressable Memory (CAM) device, comprising:

an array of CAM cells to store a number of entries, wherein a first portion of each entry includes an offset value that is unique to the entry;

a search key register coupled to the CAM array and configured to store a search key;

a priority encoder having an input coupled to the CAM array and having an output to provide an entry from the CAM array that matches the search key in a first compare operation in the CAM array; and multi-match extraction logic having an input coupled to the output of the priority encoder and having an output coupled to the CAM array, wherein the multi-match extraction logic is configured to generate a modified search key by modifying the first portion of the matching entry wherein each entry in the CAM array includes a descriptor field value that is used to generate the modified search keys.

26. The CAM device of claim 25, wherein the search key register is configured to provide the modified search key to the CAM array in a subsequent compare operation in the CAM array.

27. The CAM device of claim 25, wherein the multi-match extraction logic comprises:

search key logic having a first input coupled to the search key register, a second input coupled to the priority encoder, and an output to generate the modified search key;

a counter to store a counter value indicating how many entries match the search key; and a modified search key register to store the modified search key.

28. A method, comprising:

receiving a search key;

masking a first portion of the search key to generate a masked search key;

comparing the masked search key with a plurality of entries stored in a CAM array in a first compare operation;

extracting a matching entry from the CAM array in response to the first compare operation;

modifying a first portion of the matching entry to generate a modified search key;

comparing the modified search key with the plurality of entries in the same CAM array in a second compare operation; and extracting an additional matching entry from the same CAM array in response to the second compare operation wherein each entry in the CAM array includes a descriptor field value that is used to generate the modified search keys.

29. The method of claim 28, wherein the first portion of each entry stored in the CAM array comprises a unique offset value.

30. The method of claim 28, wherein the entries comprise network addresses, and the first portion of each entry comprises a prefix length.

* * * * *